United States Patent
Dielissen et al.

(10) Patent No.: US 7,113,554 B2
(45) Date of Patent: Sep. 26, 2006

(54) TURBO DECODER SYSTEM COMPRISING PARALLEL DECODERS

(75) Inventors: Johannus Theodorus Matheus Hubertus Dielissen, Eindhoven (NL); Josephus Antonius Huisken, Eindhoven (NL); Jozef Louis Van Meerbergen, Eindhoven (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 868 days.

(21) Appl. No.: 10/078,955

(22) Filed: Feb. 19, 2002

(65) Prior Publication Data

US 2002/0136332 A1   Sep. 26, 2002

(30) Foreign Application Priority Data

Feb. 23, 2001   (EP)   .................. 01200666

(51) Int. Cl.
*H03D 1/00* (2006.01)
*H03M 13/29* (2006.01)
*H03M 13/03* (2006.01)

(52) U.S. Cl. .............. 375/341; 375/340; 714/758; 714/795

(58) Field of Classification Search ........... 375/340, 375/341; 714/752, 786, 794–5, 758
See application file for complete search history.

(56) References Cited

U.S. PATENT DOCUMENTS

| | | | |
|---|---|---|---|
| 6,252,917 B1 * | 6/2001 | Freeman | 375/340 |
| 6,289,486 B1 * | 9/2001 | Lee et al. | 714/788 |
| 6,307,901 B1 * | 10/2001 | Yu et al. | 375/341 |
| 6,516,437 B1 * | 2/2003 | Van Stralen et al. | 714/755 |
| 6,813,742 B1 * | 11/2004 | Nguyen | 714/794 |
| 6,859,906 B1 * | 2/2005 | Hammons et al. | 714/786 |
| 6,940,928 B1 * | 9/2005 | Cameron | 375/341 |
| 2001/0010089 A1 * | 7/2001 | Gueguen | 714/786 |
| 2002/0046371 A1 * | 4/2002 | Halter | 714/702 |
| 2002/0062464 A1 * | 5/2002 | Park et al. | 714/701 |
| 2002/0071505 A1 * | 6/2002 | Cameron et al. | 375/341 |
| 2002/0124227 A1 * | 9/2002 | Nguyen | 714/786 |

FOREIGN PATENT DOCUMENTS

EP   0973292 A2   7/1999

* cited by examiner

*Primary Examiner*—Emmanuel Bayard
*Assistant Examiner*—Lawrence Williams

(57) ABSTRACT

A turbo decoder system (1) for decoding turbo coded bits, is provided with a system input (2) and a plurality of turbo decoders (3; 3-1, . . . 3-n) each having a turbo decoder input (4; 4-1, . . . 4-n). The plurality of turbo decoders (3; 3-1, . . . 3-n) is arranged in parallel, and the system (1) is further provided with an allocating device (6) coupled between the system input (2) and the turbo decoder inputs (4; 4-1, . . . 4-n) for dynamically allocating the turbo coded bits to one of the turbo decoders (3; 3-1, . . . 3n).

11 Claims, 2 Drawing Sheets

TURBO DECODER SYSTEM COMPRISING PARALLEL DECODERS

The present invention relates to a decoder system for decoding a turbo coded bit stream, the decoder system is provided with a system input and a plurality of turbo decoders each having a turbo decoder input.

The present invention also relates to a turbo decoder for application in such a turbo decoder system and to a communication device provided with such a turbo decoder system.

Such a decoder system is known from a paper entitled: 'Multiple Turbo Codes' by D. Divsalar and F. Pollara, MILCOM 95, Nov. 5–8, 1995, San Diego, Calif. The known decoder system comprises a multiple turbo decoder structure. The multiple turbo decoder structure can be provided by several block decoders, as shown in FIG. 5 thereof. These block decoders indicated MAP or SOVA can be implemented as a pipeline or feedback. Outputs of the block decoders are added in a summing device, together with the original signal variables received from a transmission channel filter, where alter a hard limiter provides the decoded output bits of the turbo decoder. This multiple turbo decoder structure needs to apply an extensive input memory for storing the stream of signal variables from the transmission channel filter, and needs to sequentially store the separate output variables from each of the block decoders. In particular these variables have to be stored in temporary input memories during a certain process period, until all variables are processed by the separate block decoders. Only thereafter can these variables be used by the summing device, where after the memories are free for processing a new stream of signal variables. This results in necessary bulky and rigid memory and memory controllers, which are expensive and not used in a time-effective manner. It is a further disadvantage that the input stream memories are relatively costly. Furthermore the input memories provide dominant chip area cost and need fast controllers.

Therefore it is an object of the present invention to provide a turbo decoder system which is more cost effective and flexible.

Thereto the turbo decoder system according to the present invention is characterised in that the plurality of turbo decoders is arranged in parallel, and that the turbo decoder system is further provided with an allocating device coupled between the system input and the turbo decoder inputs for dynamically allocating turbo coded bits to one of the turbo decoders.

It is an advantage of turbo decoder system according to the invention that each of the turbo decoders receive a separate set of input variables for parallel decoding, resulting in a very time efficient turbo decoding process. Because turbo coded bits are dynamically allocated to the turbo decoders and thus the processing load is spread over the turbo decoders, in practise there will always be a turbo decoder free for allocation by the allocating device and for decoding streams of input bits, no long waiting times arise in respect of the input memories and in addition the input memories can be smaller—reducing chip area—and thus less costly. Furthermore due to the parallel decoding process the data turbo decoding speed and performance will increase, opening new application possibilities in communication devices, such as deep space receivers, hard discs, digital networks, such as local area networks and the like.

An embodiment of the turbo decoding device according to the invention is characterised in that the turbo decoder system is provided with one of more stop units coupled to at least one of the turbo decoders.

Advantageously such a stop unit coupled to a turbo decoder is capable of stopping the iteration process in the turbo decoder concerned at an early stage, wherein the turbo decoder output signal is sufficiently accurate. The turbo decoder is thereafter free for being allocated by the allocating device in order to receive a successive bit streams for decoding. This allows for different, though time effective decoding periods in each of the various turbo decoders.

A further embodiment of the turbo decoder system according to the invention is characterised in that at least one of the parallel turbo decoders comprises two block decoders in a feedback arrangement.

Advantageously the feedback results in a looped back iteration process, wherein the results of the first block decoding process in the first block decoder is used as an input for the second block decoder, which is again fed back to the first decoder etcetera. After a fixed or preferably variable number of iterations prescribed by the stop unit(s), accuracy requirements and in particular bit error rate (BER) requirements of the output signal are met and the block decoding process may end as soon as possible.

A still further embodiment of the turbo decoder system according to the invention is characterised in that the interleavers and de-interleavers, which are generally interspersed in the two block decoder feedback arrangement, comprise respective addressing units.

It is an advantage of the respective addressing units that each of them can practically be realised in a single usually software related—combined—implementation, which saves additional hardware as well as necessary power.

Another embodiment of the turbo decoder system according to the invention is characterised in that the allocating device, the stop units and/or the addressing units respectively are implemented by means of software.

This embodiment of the turbo decoder system according to the invention is programmable and thus flexible and fast adaptable to various requirements and types of possible turbo codes.

At present the turbo decoder system and communication device provided therewith and according to the invention will be elucidated further together with their additional advantages, while reference is being made to the appended drawing, wherein similar components are being referred to by means of the same reference numerals. In the drawing.

Figure 1:
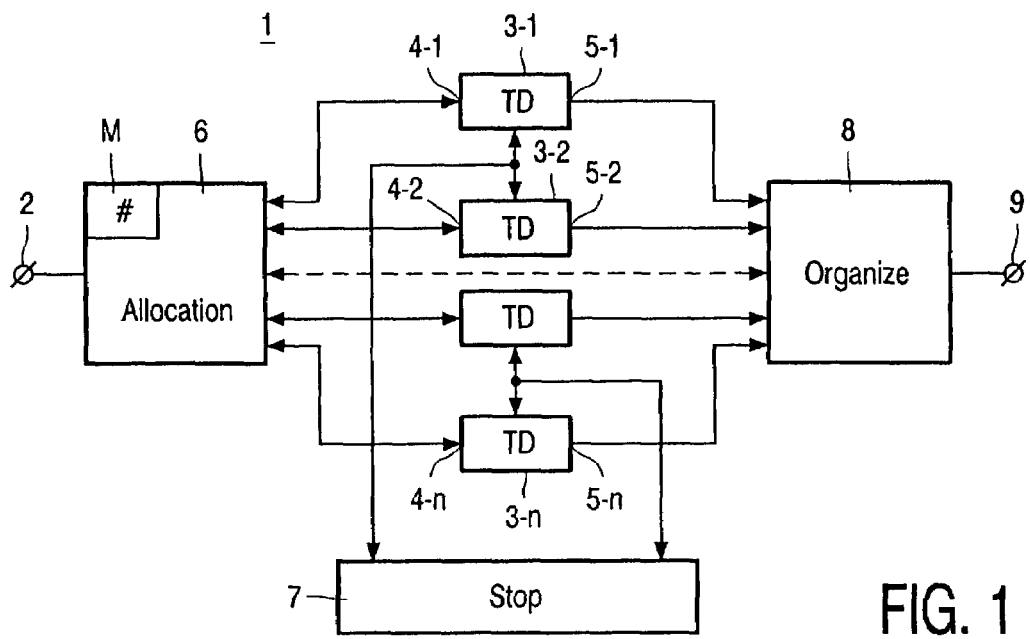
FIG. 1 shows a general outline of a basic embodiment of the turbo decoder system according to the present invention.

FIG. 1 shows a turbo decoder system 1 having a system input 2 coupled usually through a channel filter, to one end of a transmission channel (not shown), which may be the air, free space or a glass fibre cable, coaxial (network) cable or the like. The system input 2 receives a stream of bits, which are encoded by a turbo encoder in a receiver connected to the other end of the transmission channel. Such a turbo encoder TE which will be explained hereafter may be embodied as shown in FIG. 2.

Turbo codes are known to the man skilled in the art of channel coding theory, since a first article entitled: 'Near Shannon Limit Error-Correcting Coding and Decoding; Turbo Codes', by C. Berrou, A. Glavieux, and P. Thitimajshima, IEEE Proceedings of ICC '93, pp 1064–1070, May 1993. Turbo coding is a form of channel coding known for its outstanding Bit Error Rate (BER). Turbo coding can for example be applied in all kinds of communication devices, such as deep space receivers, hard discs, digital networks, such as local area networks and the like, where reliable communication is of vital importance. Turbo decoding featuring iterative decoding will be described further in the remainder of this description.

The turbo decoder system 1 is provided with a plurality of turbo decoders 3-1, 3-2, . . . 3-n connected in a parallel arrangement. Each of the turbo decoders TD—with general reference numeral 3—have respective turbo decoder inputs 4-1, 4-2, . . . 4-n and turbo decoder outputs 5-1, 5-2, . . . 5-n. The system 1 is further provided with an allocating device 6 which is coupled between the system input 2 and each of the respective decoder inputs 4. The allocating device 6 which comprises a temporary bit stream memory M is capable of dynamically allocating turbo coded bit streams at system input 2 to one of the generally two or more turbo decoders 3, whose construction will be explained later on in the description. The one turbo decoder 3 which is dynamically designated by the allocating device 6 for receiving the turbo coded bit stream, is usually influenced by noise added to the bit stream in the transmission channel, and starts working on the coded bit stream by iteratively decoding bit blocks of the bitstream, until its decoder output provides an estimate of the encoder input stream, which is sufficiently accurate and free of bit errors. The system 1 is provided with one or, as desired, more than one dispersed stop units 7—generally one for each turbo decoder TD—which units 7 are coupled to the respective turbo decoders 3. Working of the respective turbo decoder will be stopped under the control of its stop unit 7 connected thereto, if the desired accuracy in the decoded output signal is reached. Then the decoded output block is stored in a standard available and cheap memory of an organiser 8, which is coupled to each of the decoder outputs 5 of the turbo decoders 3. The processing time of the input bit stream may vary from one turbo decoder to another and will generally depend on the signal to noise ratio of the input bit stream block. The signal to noise ratio thereof depends on the characteristics of the noise with which the signal through the transmission channel is disturbed. The turbo decoders 3 work independently from one another, so if one is busy the allocating device 6 will be informed thereof and designate another turbo decoder 3 to do the next turbo decoding job. Because the various processing times of the turbo decoders 3 may vary, the order of the respective output bit streams to organiser 8 may be subjected to changes with respect to the order of the input bit streams. If the input order is disturbed the organiser 8 will restore the proper order of the decoded bit blocks at an output 9 of the organiser 8.

Figure 2:
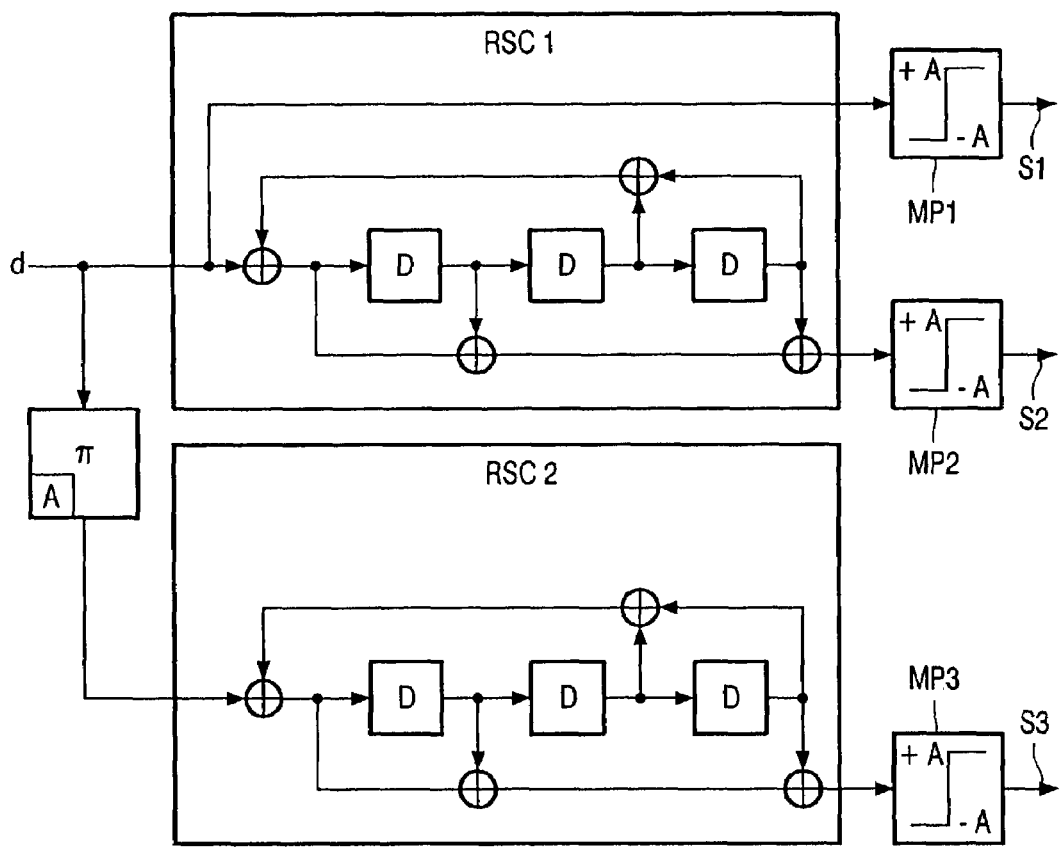
FIG. 2 shows an example of a turbo encoder for explaining turbo encoding and turbo decoding in the turbo decoder system according to FIG. 1.

Just by way of example FIG. 2 shows a turbo channel encoder TE, whose functioning will be summarised as follows. The encoder TE maps an incoming message or word d to a code word s, which is to be sent over the transmission channel. In this case for each input bit three output bits are produced, resulting in a rate ⅓ code. Of all possible messages only that fraction is used for encoding which have the largest mutual Euclidean distances, in order to minimise the probability that an incorrect code word will be received at the turbo decoder TD end. The encoder TE as shown comprises two Recursive Systematic Coders, i.e. RSC1 and RSC2, each comprising delay lines D and modulo 2 adders (circled additions) coupled as shown in FIG. 2. The two RSC's are separated by an interleaver Π for dividing the input bit stream in blocks having lengths N and shuffling these blocks. For each input bit three output bits s1, s2, and s3 are produced after mappings in appropriate mappers MP1, MP2 and MP3, i.e. a systematic bit s1 and a parity bit s2 of RSC1 and a parity bit s3 of RSC2. After processing N input bits the RSC's terminate their so called trellis, which is a well known state diagram as a function of the time. This results in 6 additional bits that is 3 systematic and 3 parity bits for each trellis. The encoded output bits s1, s2 and s3 are sent over the transmission channel to the system input 2 of turbo decoder system 1 of FIG. 1.

Figure 3:
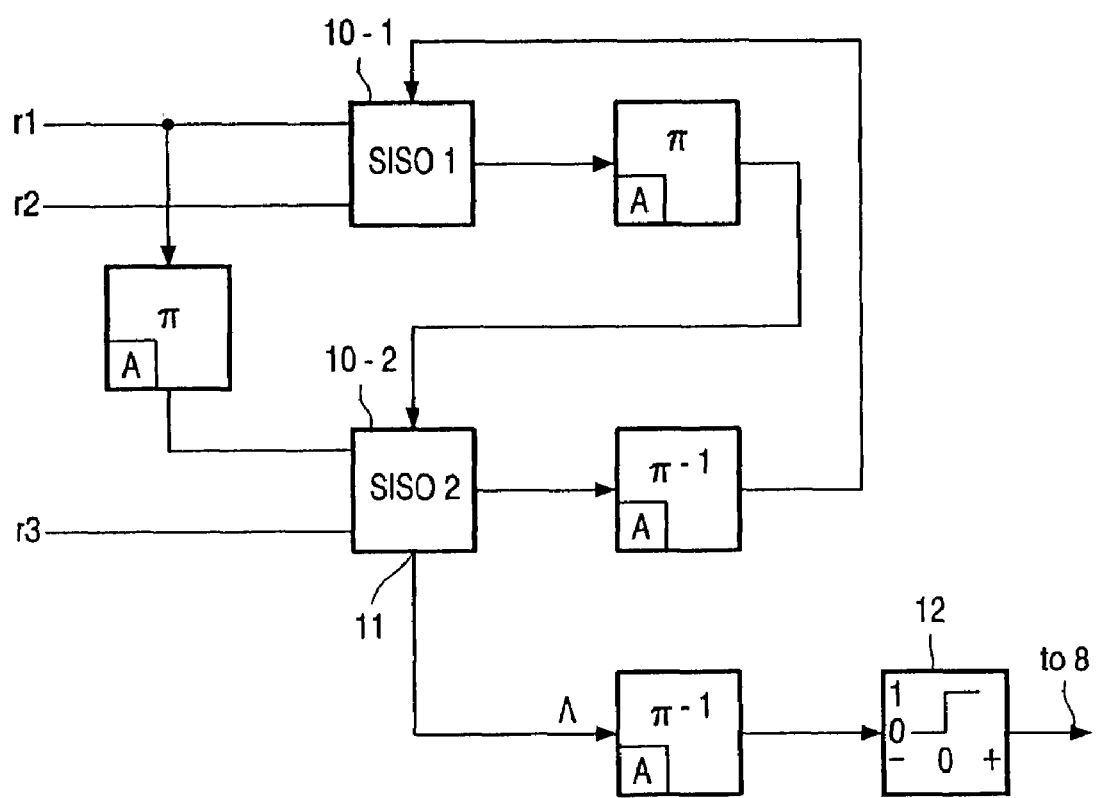
FIG. 3 shows a possible embodiment of a turbo decoder for application in the turbo decoder system according to FIG. 1.

Each turbo decoder TD, such as 3-1, . . . 3-n may for example be embodied as outlined in FIG. 3. The decoder TD has the structure of a Parallel Concatenated Convolution Coder PCCC) turbo decoder having a first Soft Input/Soft Output (SISO) block decoder 10-1 and a second block decoder SISO 10-2, mutually coupled in a feedback arrangement. SISO 10-1 is executed for decoding a received input r1 and r2, which is representative for the output signals s1 and s2 respectively of RSC1 (see FIG. 2), while SISO 10-2 decodes a received input r3, which is representative for the output signal s3 of RSC2. An output of SISO1 is processed in an interleaver Π and then used as a-priori information in SISO2 for decoding RSC2. In a next iteration an output of SISO2 is de-interleaved in de-interleaver $\Pi^{-1}$, whose output is used in SISO1 as fed back a-priori information for further decoding RSC1. This schedule can be continued until some stopping criterion implemented in stop unit 7 is met, where after a further output signal Λ is provided on output 11 of SISO2, which is then de-interleaved in $\Pi^{-1}$ and demapped in demapper 12 to provide the decoded output signal at output 5 of the turbo decoder TD concerned for further handling by the organiser 8.

The interleavers Π and de-interleavers $\Pi^{-1}$ comprise generally known memory and addressing units A for addressing the bit blocks and shuffling these bit blocks. The handling of the bit blocks and the necessary hardware can be simplified by combining the control and hardware for execution of the handling. It is preferred for reasons of flexibility that the allocating device 6, the stop unit(s) 7 and/or the above mentioned addressing units A are implemented by means of software.

Whilst the above has been described with reference to essentially preferred embodiments and best possible modes it will be understood that these embodiments are by no means to be construed as limiting examples of the turbo decoding system concerned, because various modifications, features and combination of features falling within the scope of the appended claims are now within reach of the skilled person.

The invention claimed is:

1. A turbo decoder system for decoding turbo coded bits, the turbo decoder system is provided with a system input and a plurality of turbo decoders each having a turbo decoder input, characterised in that the plurality of turbo decoders is arranged in parallel, and that the turbo decoder system is further provided with an allocating device coupled between the system input and the turbo decoder inputs for dynamically allocating the turbo coded bits to one of the turbo decoders, the turbo decoder system further comprising at least one stop unit coupled to at least one turbo decoder to interrupt decoding occurring in each turbo decoder when a selected degree of accuracy of decoding in a respective turbo decoder has been reached.

2. The turbo decoder system according to claim 1, characterised in that the turbo decoder system is provided with a plurality of said stop units, each stop unit being coupled to a plurality of the turbo decoders.

3. The turbo decoder system according to claim 1, characterised that in at least one of the parallel turbo decoders comprises two block decoders in a feedback arrangement.

4. The turbo decoder system according to claim 3, characterised in that interleavers and de-interleavers are interspersed in the two block decoder feedback arrangement.

5. The turbo decoder system according to claim 4, characterised in that the interleavers and de-interleavers comprise respective addressing units.

6. The turbo decoder system according to claim 1, characterised in that the allocating device, the stop units and/or the addressing units respectively are implemented by means of software.

7. A turbo decoder method for decoding turbo coded bits, comprising: providing a system input and a plurality of turbo decoders arranged in parallel, each turbo decoder having a turbo decoder input, providing an allocating device coupled between the system input and the turbo decoder inputs for dynamically allocating the turbo coded bits to the turbo decoders, allocating turbo coded bits from the allocating device to the turbo decoders so that turbo coded bits are allocated to turbo decoders that are not busy decoding previously allocated turbo coded bits from the allocating device, coupling at least one stop unit to at least one turbo decoder, and using the at least one stop unit to interrupt decoding occurring in each turbo decoder when a selected degree of accuracy of decoding in a respective turbo decoder has been reached.

8. The turbo decoder method according to claim 7, including providing two block decoders in a feedback arrangement in each turbo decoder.

9. The turbo decoder method according to claim 8, including connecting interleavers and de-interleavers to the two block decoder feedback arrangement.

10. The turbo decoder method according to claim 9, wherein the interleavers and de-interleavers comprise respective addressing units.

11. The turbo decoder method according to claim 10, wherein the allocating and interrupting steps are implemented by means of software.

* * * * *